(12) United States Patent
Smith

(10) Patent No.: US 6,541,945 B1
(45) Date of Patent: Apr. 1, 2003

(54) APPARATUS AND METHOD FOR SHARING TWO OR MORE AMPLIFIERS TO AN ARRAY OF PASS CIRCUITS IN A REGULATOR CIRCUIT

(75) Inventor: Gregory J. Smith, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/022,026

(22) Filed: Dec. 13, 2001

(51) Int. Cl.[7] ................................................ G05F 1/40
(52) U.S. Cl. ...................... 323/269; 361/18; 361/91.5; 327/309
(58) Field of Search ........................ 361/18, 91.1, 91.5; 327/309; 307/44, 64; 323/269

(56) References Cited

U.S. PATENT DOCUMENTS

| | | | | |
|---|---|---|---|---|
| 3,947,776 A | * | 3/1976 | Stevens et al. ............. | 327/374 |
| 4,382,198 A | * | 5/1983 | Ishijima et al. ............ | 327/309 |
| 5,206,548 A | * | 4/1993 | Takahashi et al. .......... | 327/309 |
| 5,428,524 A | * | 6/1995 | Massie ....................... | 363/79 |
| 6,201,674 B1 | * | 3/2001 | Warita et al. ............... | 323/277 |
| 6,316,956 B1 | | 11/2001 | Oglesbee ..................... | 326/10 |

\* cited by examiner

*Primary Examiner*—Shawn Riley
(74) *Attorney, Agent, or Firm*—Merchant & Gould, P.C.; Joshua W. Korver

(57) ABSTRACT

An apparatus and method for a regulator circuit includes multiple amplifier circuits, multiple bias stages, and a shunt stage. Each bias stage includes a set of MOS transistors with respective resistance circuits that are arranged to bias the shunt stage. The shunt stage includes a set of MOS transistor that are arranged to regulate a potential provided by a source circuit when active. Each amplifier circuit forms a regulation loop with a respective MOS transistor of the bias stage and a MOS transistor of the shunt stage. The multiple regulation loops provide redundancy. The regulation loops do not conflict with each other. Failures or defects within one of the regulation loops does not affect the remaining regulation loops in such a way that over-voltage results from the failure. The regulator prevents an over-voltage when at least one of the regulation loops is operable.

19 Claims, 5 Drawing Sheets

APPARATUS AND METHOD FOR SHARING TWO OR MORE AMPLIFIERS TO AN ARRAY OF PASS CIRCUITS IN A REGULATOR CIRCUIT

FIELD OF THE INVENTION

The present invention relates generally to regulator circuits. More particularly, the present invention relates to an improved regulator circuit that includes two or more amplifiers that are shared to an array of pass circuits.

BACKGROUND OF THE INVENTION

Integrated circuits are often employed to regulate power. Regulator circuits may be used where the input power source is unregulated or clean power is required in a noisy environment.

A regulator circuit may be used to regulate the power provided by a battery cell. Defects in the regulator circuit can cause the voltage delivered by the battery cell to become unregulated. An unregulated voltage can cause damage to a load or other circuitry.

SUMMARY OF THE INVENTION

The present invention is directed to regulator circuits. More particularly, the present invention relates to an improved regulator circuit that includes two or more amplifiers that are arranged in a redundant architecture with an array of pass circuits. The regulator circuit regulates the potential from a source circuit to a reference potential. A shunt stage limits the source potential with a dominant loop that also includes an amplifier circuit and a corresponding bias stage. Each bias stage may include multiple bypass circuits that are arranged such that a defect in any one of the bypass circuits does not effect the operation of the improved regulator circuit. The shunt stage can also include multiple pass circuits such that a defect in any one of the pass circuits does not effect the operation of the improved regulator circuit. Compensation capacitance circuits may be coupled between the bias stages to a high impedance compensation node within each amplifier circuit. If one of the bypass circuits is defective, the compensation capacitors prevent the defect from affecting the operation of the amplifier circuits.

Briefly stated, an apparatus and method for an improved regulator circuit includes multiple amplifier circuits, multiple bias stages, and a shunt stage. Each bias stage includes a set of MOS transistors with respective resistance circuits that are arranged to bias the shunt stage. The shunt stage includes a set of MOS transistor that are arranged to regulate a potential provided by a source circuit when active. Each amplifier circuit forms a regulation loop with a respective MOS transistor of the bias stage and a MOS transistor of the shunt stage. The multiple regulation loops provide redundancy. The regulation loops do not conflict with each other. Failures or defects within one of the regulation loops does not affect the remaining regulation loops in such a way that over-voltage results from the failure. The improved regulator prevents an over-voltage when at least one of the regulation loops is operable.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

The present invention generally relates to an improved regulator circuit that includes two or more amplifiers that are arranged in a redundant architecture with an array of pass circuits. The improved regulator circuit includes at least two amplifier circuits, each having a corresponding bias stage, and a shunt stage. The amplifier circuits are arranged to regulate the potential from a source circuit to a reference potential. The shunt stage limits the source potential. Furthermore, each bias stage may include multiple bypass circuits, such that a defect in any one of the bypass circuits does not effect the operation of the improved regulator circuit. In addition, the shunt stage can also include multiple pass circuits such that a defect in any one of these pass circuits does not effect the operation of the improved regulator circuit. Compensation capacitance circuits are coupled between the bias stages to a high impedance compensation node within the each amplifier circuit. If one of the bypass circuits is defective, the compensation capacitance circuits prevent the defect from affecting the stability of the amplifier circuits.

Figure 1:
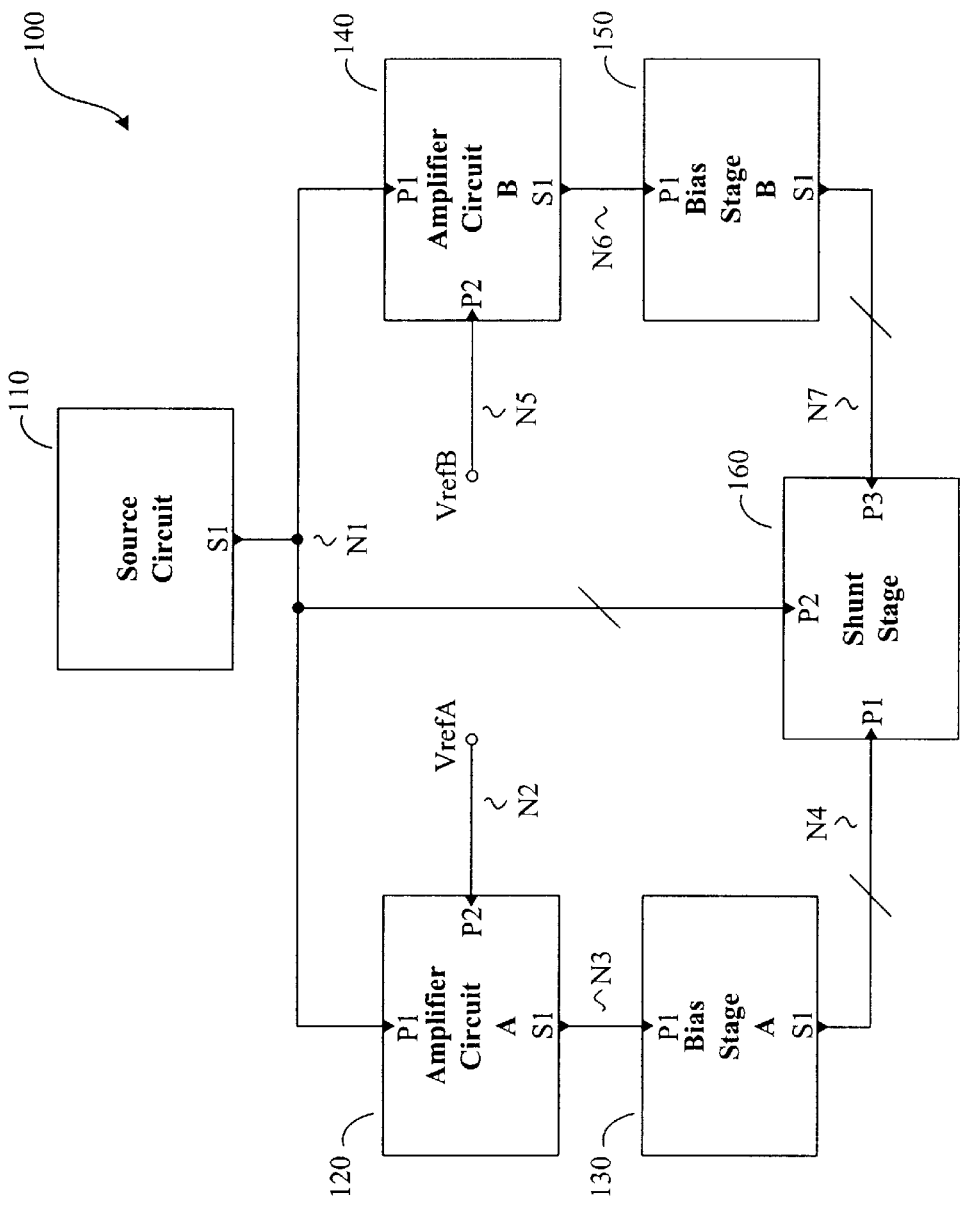
FIG. 1 illustrates a schematic diagram of an exemplary regulator circuit with redundancy.

FIG. 1 illustrates a schematic diagram of an exemplary regulator circuit with redundancy in accordance with the present invention. The exemplary regulator circuit (100) receives a signal from a source circuit (110), and includes two amplifier circuits (120, 140), two bias stages (130, 150), and a shunt stage (160).

The source circuit (110) includes an output (S1) that is coupled to node N1. The first amplifier circuit, amplifier circuit A (120) includes a first input (P1) coupled to node N1, a second input (P2) that is coupled to node N2, and an output (S1) that is coupled to node N3. The first bias stage, bias stage A (130), includes an input (P1) that is coupled to node N3 and an output (S1) that is coupled to node N4. The second amplifier circuit, amplifier circuit B (140) includes a first input (P1) coupled to node N1, a second input (P2) that is coupled to node N5, and an output (S1) that is coupled to node N6. The second bias stage, bias stage B (150), includes an input (P1) that is coupled to node N6 and an output (S1) that is coupled to node N7. The shunt stage (160) includes a first input (P1) that is coupled to node N4, a second input (P2) that is coupled to node N1, and a third input (P3) that is coupled to node N7.

In operation, the source circuit (110) provides a power signal to node N1. Each amplifier circuit (120, 140) forms a control loop, or regulation loop, with its respective bias stage (130, 150) and the shunt stage (160). Each regulation loop operates similarly. As an example, amplifier circuit A (120) compares the power signal to a reference signal (VrefA) that is provided to node N2. Amplifier circuit A (120) produces a control signal in response to the comparison of the potential at node N1 and VrefA. Bias stage A (130) produces a bias signal in response to the comparison between the potential at node N1 and VrefA. The bias signal is utilized to biases the shunt stage (160) as active or inactive. If the potential at node N1 and the potential of VrefA are different potentials, the shunt stage (160) is biased active. The shunt stage (160) then regulates the potential at node N1 to match the potential of VrefA.

The presence of both regulation loops in the regulator circuit (100) provides redundant regulation of the potential at node N1. The configuration of each regulation loop ensures that the regulation loops cooperate with one another. When both regulation loops are operational, the regulation loop that is balanced at a lower potential is dominant in controlling the potential at node N1. The dominance of one of the regulation loops does not detrimentally effect operation of either regulation loop. When one of the regulation loops is "open", inoperable, or defective such that it provides no regulation, the other regulation loop is dominant. In addition, the operation of the regulator circuit (100) may alter to operate as a failsafe circuit. The regulator circuit (100) operates as a failsafe circuit when a defective occurs such that potential at node N1 is regulated at a potential lower than the potential specified for the regulator circuit. The configuration of each regulation loop is described in greater detail with regards to FIGS. 2–5.

It is appreciated that the potential at node N1 can be used as a regulated output voltage for other circuits. In one example, the regulator circuit (100) is used to regulate the maximum charging of a battery cell. The redundancy scheme protects the battery cell from over-charging that may occur due to a failure in the regulator circuit (100). If one of the regulation loops fails, another regulation loop regulates the potential at node N1. The regulator circuit (100) continues to operate to prevent an over-voltage at node N1 despite failures within the circuit.

The bias stages (130, 150) can be included as an output stage of the amplifier circuits (120, 140). In this case, the amplifier circuits (120, 140) include an input stage and a possible second stage. The bias stages (130, 150) represent the output stages or a portion of the output stages for their respective amplifier circuits (120, 140).

Figure 2:
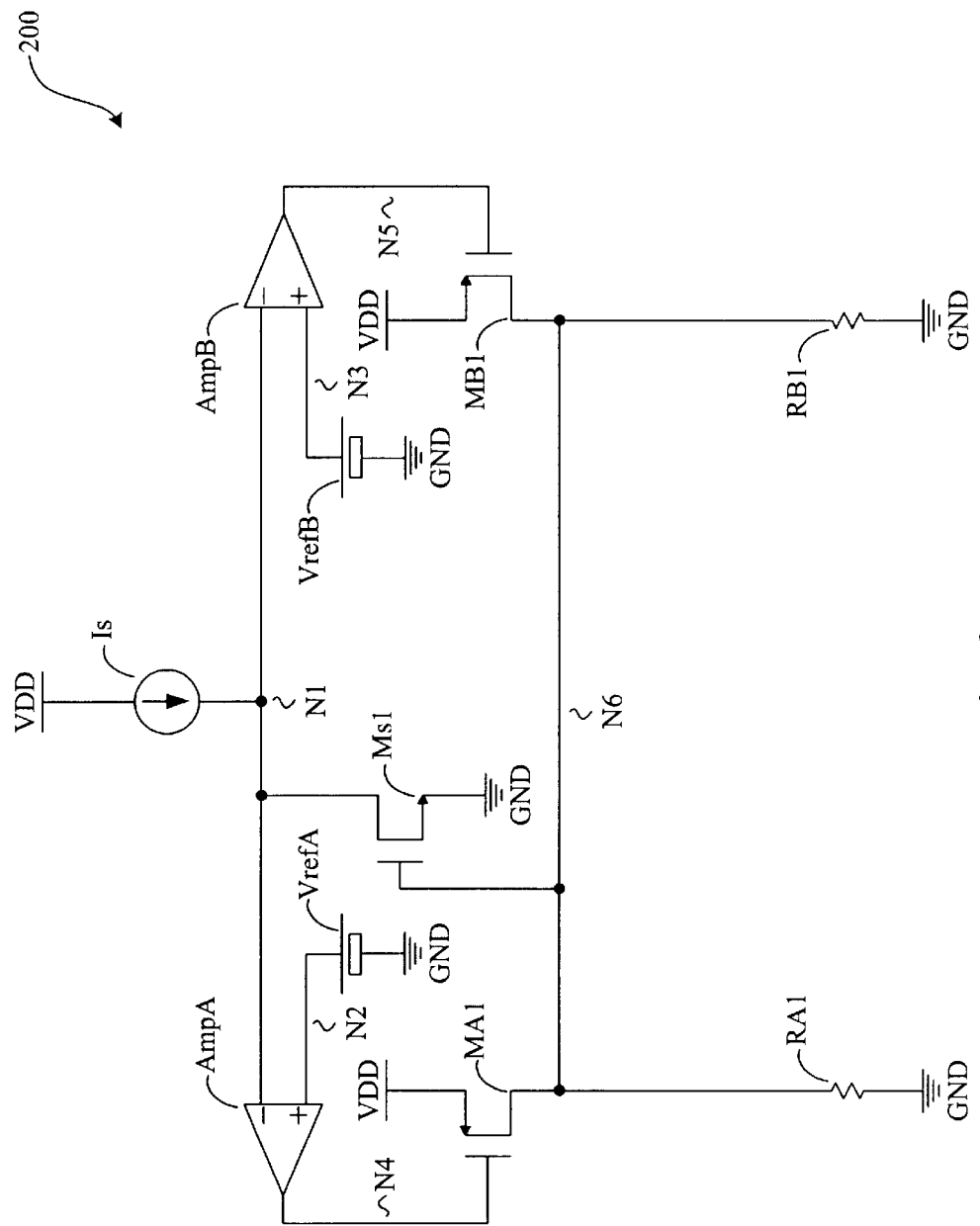
FIG. 2 shows a schematic diagram of another exemplary regulator circuit with redundancy.

FIG. 2 shows a schematic diagram of another exemplary regulator circuit with redundancy in accordance with the present invention. The exemplary regulator circuit (200) receives a current from a current source (Is), and includes two amplifier circuits (AmpA, AmpB), two reference circuits (VrefA, VrefB), three MOS transistors (MA1, MB1, Ms1), and two resistance circuits (RA1, RB1).

The current source (Is) is coupled between a power supply node (VDD) and node N1. The first amplifier circuit (AmpA) includes an inverting input that is coupled to node N1, a non-inverting input that is coupled to node N2, and an output that is coupled to node N4. The second amplifier circuit (AmpB) includes an inverting input that is coupled to node N1, a non-inverting input that is coupled to node N3, and an output that is coupled to node N5. The first reference circuit (VrefA) is coupled between node N2 and a ground terminal (GND). The second reference circuit (VrefB) is coupled between node N3 and the ground terminal (GND). The first MOS transistor (MA1) is a PMOS transistor that includes a gate that is coupled to node N4, a source that is coupled to the power supply node (VDD), and a drain that is coupled to node N6. The second MOS transistor (MB1) is a PMOS transistor that includes a gate that is coupled to node N5, a source that is coupled to the power supply node (VDD), and a drain that is coupled to node N6. The third MOS transistor (Ms1) is an NMOS transistor that includes a gate that is coupled to node N6, a source that is coupled to the ground terminal (GND), and a drain that is coupled to node N1. The first resistance circuit (RA1) is shown as a resistor and is coupled between node N6 and the ground terminal (GND). The second resistance circuit (RB1) is shown as a resistor and is coupled between node N6 and the ground terminal (GND).

In operation, the regulator circuit (200) operates similar to the regulator circuit (100) shown in FIG. 1. The current source (Is) supplies a current to a source node (N1). The potential at the source node (N1) is then regulated by one of two control or regulation loops. The regulation loops include an amplifier circuit (AmpA, AmpB), a corresponding PMOS transistor (MA1, MB1) and a corresponding resistance circuit (RA1, RB1) for each amplifier circuit, and a commonly-shared NMOS transistor (Ms1). Each regulation loop may operate to regulate the potential at the source node (N1) depending on which regulation loop is dominant.

In one example, amplifier circuit AmpA is part of the dominant loop that regulates the potential at node N1. PMOS transistor MA1 operates as a controlled pull-up transistor, or as a first single-transistor inverting gain stage. Resistance circuit RA1 operates as a passive load, providing a passive pull-down of the potential at a control node (N6). NMOS transistor Ms1 operates as a controlled pull-down transistor, or second single-transistor gain stage. NMOS transistor Ms1 is deactivated when the potential at the control node (N6) is near ground (GND). Amplifier circuit AmpA compares the potential at node N1 with the reference potential provide at node N2 by the reference circuit (VrefA). The potential of a control signal at node N4 is reduced by amplifier circuit AmpA when the potential at node N1 exceeds the potential at node N2. PMOS transistor MA1 activates in response to the decreased potential of the control signal at node N4. The potential at the control node (N6) increases in response to the activation of PMOS transistor MA1. NMOS transistor Ms1 activates in response to the increase in potential at the control node (N6). NMOS transistor Ms1 shunts the current at node N1 to ground (GND), decreasing the potential at node N1.

The regulation loop including amplifier circuit AmpB operates similar to the regulation loop including amplifier circuit AmpA described above. The regulator circuit (200) in FIG. 2 illustrates an implementation using two amplifier circuits in two regulation loops to regulate the same node. However, more than the two amplifier circuits (AmpA, AmpB) shown in FIG. 2 may be used. Additional amplifier circuits may be added to introduce further redundancy in the regulator circuit (200). The redundancy introduced by using multiple amplifier circuits ensures that defects occurring in any one regulation loop does not effect the operation of the regulator circuit (200).

Figure 3:
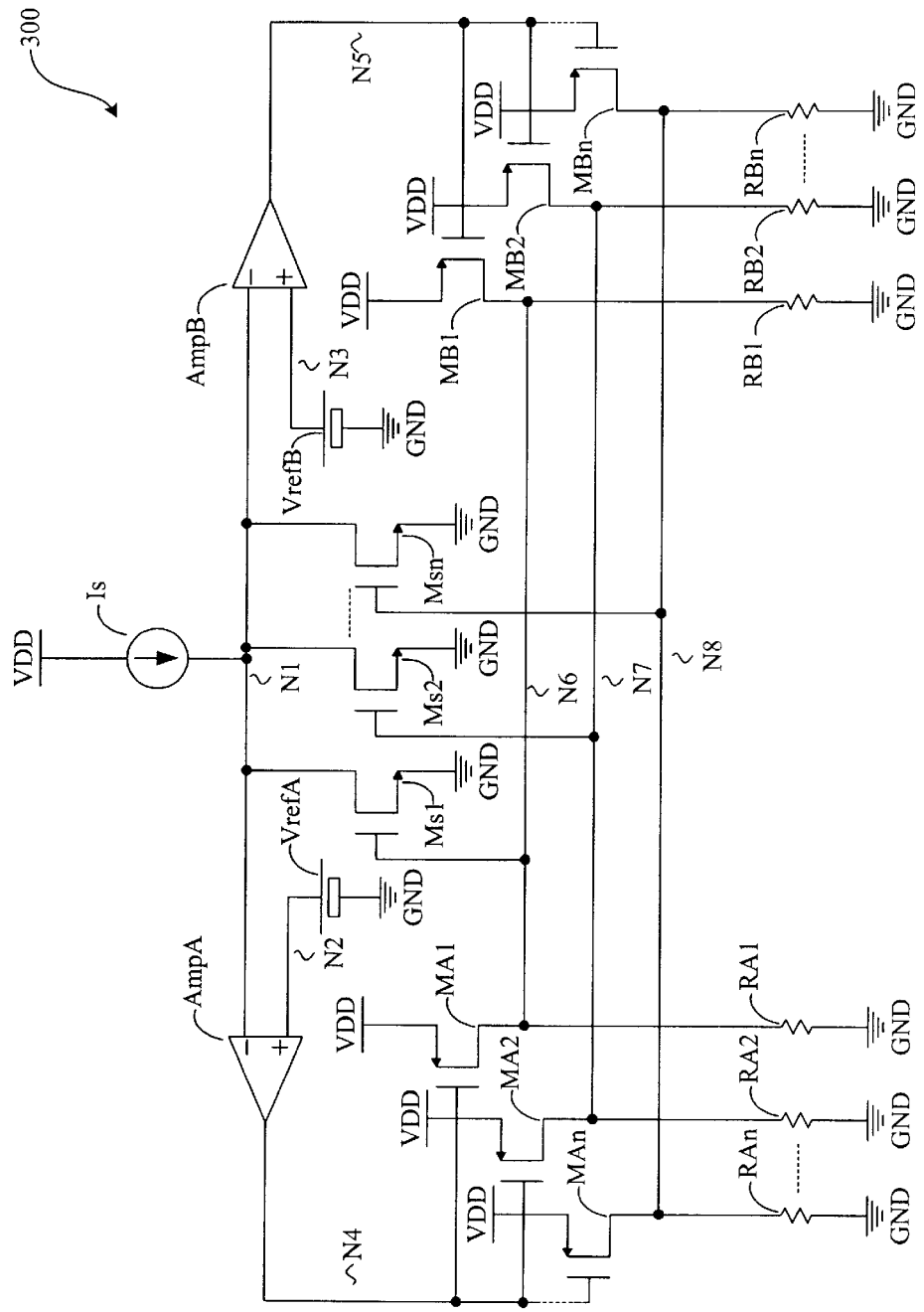
FIG. 3 illustrates a schematic diagram of another exemplary regulator circuit with redundancy.

FIG. 3 shows a schematic diagram of another exemplary regulator circuit with redundancy in accordance with the present invention. The exemplary regulator circuit (300) receives a current from a current source (Is), and includes two amplifier circuits (AmpA, AmpB), two reference circuits (VrefA, VrefB), three sets MOS transistors (MA1–MAn, MB1–MBn, and Ms1–Msn), and two sets of resistance circuits (RA1–RAn, RB1–RBn).

The current source (Is) is coupled between a power supply node (VDD) and node N1. The first amplifier circuit (AmpA) includes an inverting input that is coupled to node N1, a non-inverting input that is coupled to node N2, and an output that is coupled to node N4. The second amplifier circuit (AmpB) includes an inverting input that is coupled to node N1, a non-inverting input that is coupled to node N3, and an output that is coupled to node N5. The first reference circuit (VrefA) is coupled between node N2 and a ground terminal (GND). The second reference circuit (VrefB) is coupled between node N3 and the ground terminal (GND).

The first MOS transistor (MA1) of the first set of MOS transistors (MA1–MAn) includes a gate that is coupled to node N4, a source that is coupled to the power supply node (VDD), and a drain that is coupled to N6. The second MOS transistor (MA2) of the first set of MOS transistors (MA1–MAn) includes a gate that is coupled to node N4, a source that is coupled to the power supply node (VDD), and a drain that is coupled to node N7. The third MOS transistor (MAn) of the first set of MOS transistors (MA1–MAn) includes a gate that is coupled to node N4, a source that is coupled to the power supply node (VDD), and a drain that is coupled to node N8.

The first MOS transistor (MB1) of the second set of MOS transistors (MB1–MBn) includes a gate that is coupled to node N5, a source that is coupled to the power supply node (VDD), and a drain that is coupled to node N6. The second MOS transistor (MB2) of the second set of MOS transistors (MB1–MBn) includes a gate that is coupled to node N5, a source that is coupled to the power supply node (VDD), and a drain that is coupled to node N7. The third MOS transistor (MBn) of the second set of MOS transistors (MB1–MBn) includes a gate that is coupled to node N5, a source that is coupled to the power supply node (VDD), and a drain that is coupled to node N8.

The first MOS transistor (Ms1) of the third set of MOS transistors (Ms1–Msn) includes a gate that is coupled to node N6, a source that is coupled to the ground terminal (GND), and a drain that is coupled to node N1. The second MOS transistor (Ms2) of the third set of MOS transistors (Ms1–Msn) includes a gate that is coupled to node N7, a source that is coupled to the ground terminal (GND), and a drain that is coupled to node N1. The third MOS transistor (Msn) of the third set of MOS transistors (Ms1–Msn) includes a gate that is coupled to node N8, a source that is coupled to the ground terminal (GND), and a drain that is coupled to node N1.

The first resistance circuit (RA1) of the first set of resistance circuits (RA1–RAn) is coupled between node N6 and the ground terminal (GND). The second resistance circuit (RA2) of the first set of resistance circuits (RA1–RAn) is coupled between node N7 and the ground terminal (GND). The third resistance circuit (RAn) of the first set of resistance circuits (RA1–RAn) is coupled between node N8 and the ground terminal (GND).

The first resistance circuit (RB1) of the second set of resistance circuits (RB1–RBn) is coupled between node N6 and the ground terminal (GND). The second resistance circuit (RB2) of the second set of resistance circuits (RB1–RBn) is coupled between node N7 and the ground terminal (GND). The third resistance circuit (RBn) of the second set of resistance circuits (RB1–RBn) is coupled between node N8 and the ground terminal (GND).

The regulator circuit (300) includes multiple regulation loops that operate similar to the regulation loops described in FIG. 2. For example, a regulation loop is formed by amplifier circuit AmpA, PMOS transistor MA1 with its respective resistance circuit RA1, and NMOS transistor Ms1. Another regulation loop is formed by amplifier circuit AmpB, PMOS transistor MB2 with its respective resistance circuit RB2, and NMOS transistor Ms2. It is appreciated that any number of additional regulation loops can be added in the present invention.

Each PMOS transistor of each set (MA1–MAn, MB1–MBn) shown in FIG. 3 is isolated from one another. If one of the PMOS transistors (MA1–MAn, MB1–MBn) or its associated resistance circuit (RA1–RAn, RB1–RBn) is inoperable or defective, the other transistors and resistance circuits remain unaffected. A failure in one of the PMOS transistors (MA1–MAn, MB1–MBn), such as a short, may result in the "failsafe" operation of the exemplary regulator circuit (300) as described in connection with FIG. 1. However, the failure in one of the PMOS transistors (MA1–MAn, MB1–MBn) does not result in an over-voltage at the source node (N1).

In addition, if one of the NMOS transistors (Ms1–Msn) is defective, the other regulation loops that do not utilize the defective NMOS transistor are unaffected. The operation of the regulation loops do not conflict with each other. The regulation loop that is configured to regulate the potential at node N1 to the lowest potential is the dominant loop, and therefore is the regulation loop that regulates the potential at node N1. In the event that all the regulation loops, except one, are inoperable or defective such that they no longer provide regulation, then the remaining regulation loop is the dominant loop. Thus, the present invention includes a multiple redundancy scheme for use in the regulator circuit (300). The regulator circuit (300) illustrates a robust circuit capable of remaining operational when sustaining a component failure in one or more of the components shown in FIG. 3.

Certain types of failures may slightly alter the operation of the regulator circuit (300) such that it operates as an over-current failsafe circuit. For example, a defect may occur where one of the resistance circuits (RA1–RAn, RB1–RBn) presents a short to ground rather than a resistive load. Such a short causes an error in the regulated potential at node N1. The potential at node N1 is regulated at a potential below a level originally designed for the regulator circuit (300). However, the regulator circuit (300) continues to operate. The regulator circuit (300) operates as a failsafe, regulating the potential at node N1 such that a subsequent circuit is protected from an over-current provided by the current source (Is). A practical example of such an over-current is the use of an incompatible charger as a power source for a battery cell. The over-current from an incompatible charger may irreparably damage a battery cell. However, the use of a regulator circuit (300) according to the present invention prevents such over-currents from over-charging the battery cell.

Figure 4:
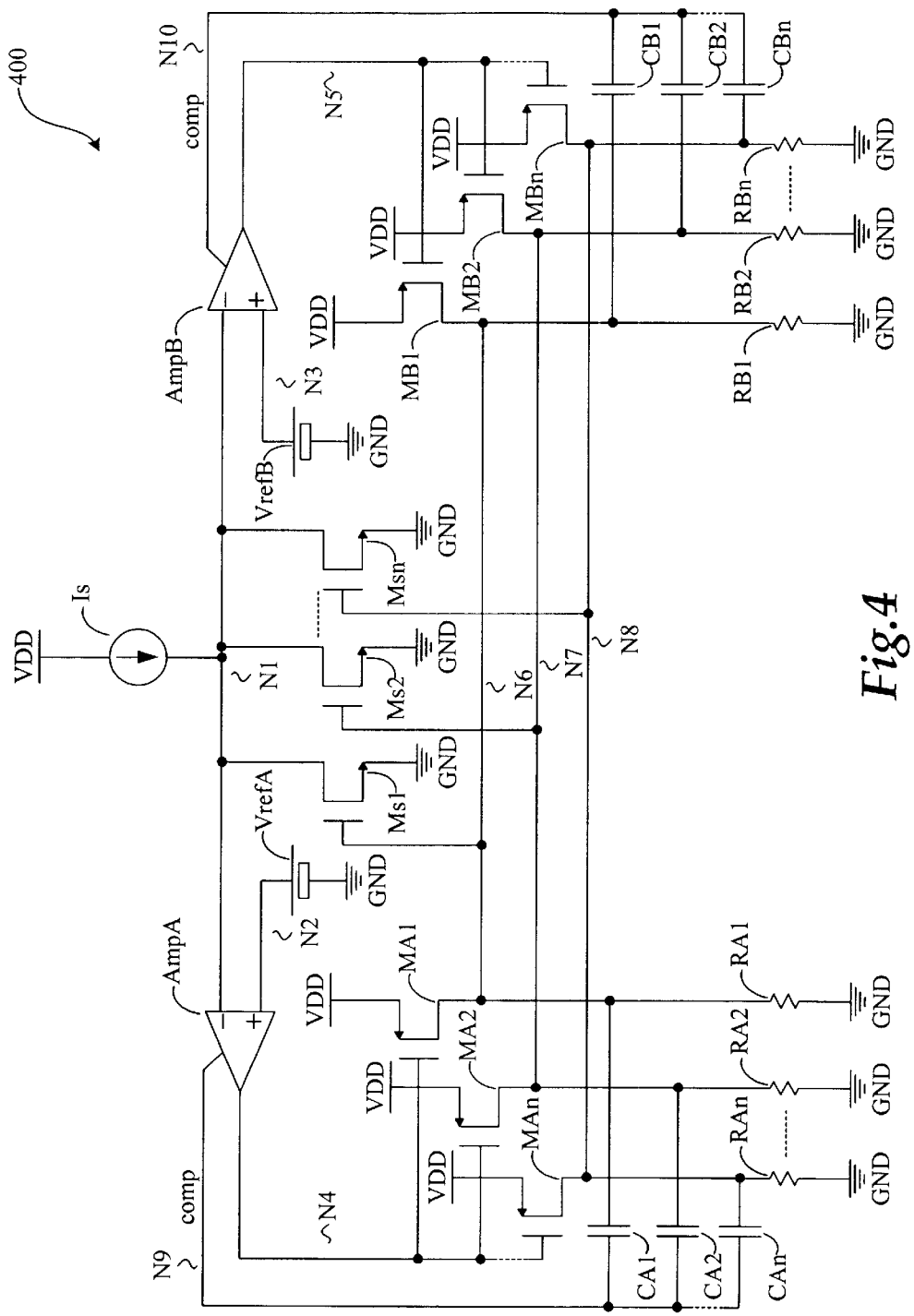
FIG. 4 shows a schematic diagram of another exemplary regulator circuit with redundancy.

FIG. 4 shows a schematic diagram of another exemplary regulator circuit with redundancy in accordance with the present invention. The exemplary regulator circuit (400) receives a current from a current source (Is), and includes two amplifier circuits (AmpA, AmpB), two reference circuits (VrefA, VrefB), three sets MOS transistors (MA1–MAn, MB1–MBn, and Ms1–Msn), two sets of resistance circuits (RA1–RAn, RB1–RBn), and two sets of capacitance circuits (CA1–CAn, CB1–CBn).

The exemplary regulator circuit (400) is connected similar to the exemplary regulator circuit (300) with the addition of the two sets of capacitance circuits (CA1–CAn, CB1–CBn). The first capacitance circuit (CA1) of the first set of capacitance circuits (CA1–CAn) is coupled between node N6 and node N9. The second capacitance circuit (CA2) of the first set of capacitance circuits (CA1–CAn) is coupled between node N7 and node N9. The third capacitance circuit (CAn) of the first set of capacitance circuits (CA1–CAn) is coupled between node N8 and node N9. The first capacitance circuit (CB1) of the second set of capacitance circuits (CB1–CBn) is coupled between node N6 and node N10. The second capacitance circuit (CB2) of the second set of capacitance circuits (CB1–CBn) is coupled between node N7 and node N10. The third capacitance circuit (CBn) of the second set of capacitance circuits (CB1–CBn) is coupled between node N8 and node N10.

In operation, the regulator circuit (400) operates similarly to the regulator circuit (300) shown in FIG. 3. The regulator circuit (400) illustrates additional compensation circuitry, shown as capacitance circuits (CA1–CAn, CB1–CBn).

Each capacitance circuit (CA1–CAn, CB1–CBn) is coupled to a common high impedance node or compensation node within each respective amplifier circuit (AmpA, AmpB). Capacitance circuits CA1–CAn operate as compensation capacitors for amplifier circuit AmpA, while capacitance circuits CB1–CBn operate as compensation capacitors for amplifier circuit AmpB. The capacitance circuits (CA1–CAn, CB1–CBn) provide redundant compensation for a possible failure in one of the MOS transistors (MA1–MAn, MB1–MBn). The amplifier circuits (AmpA, AmpB) will remain stable when one of the MOS transistors (MA1–MAn, MB1–MBn) fails such that the MOS transistor forms an open circuit. The capacitance circuits (CA1–CAn, CB1–CBn) provide for Miller-type compensation of the regulator circuit (400). The compensation provided by the capacitance circuits (CA1–CAn, CB1–CBn) increases the reliability of the stability in the regulator circuit (400).

Figure 5:
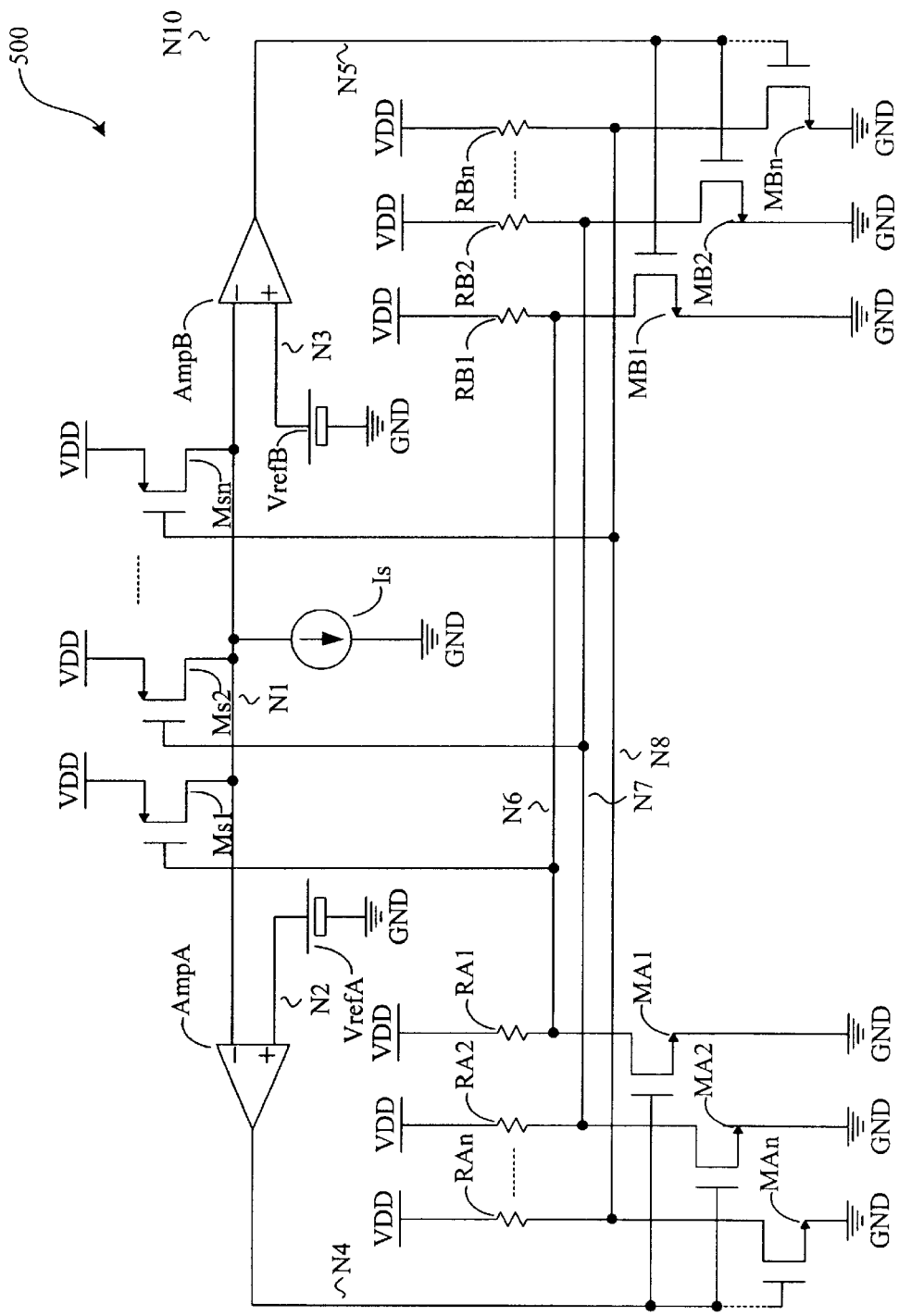
FIG. 5 illustrates a schematic diagram of an alternative embodiment or the circuit in FIG. 3, in accordance with the present invention.

FIG. 5 illustrates a schematic diagram of an alternative embodiment for the circuit in FIG. 3 in accordance with the present invention. The exemplary regulator circuit (500) includes a current source (Is), two amplifier circuits (AmpA, AmpB), two reference circuits (VrefA, VrefB), three sets MOS transistors (MA1–MAn, MB1–MBn, and Ms1–Msn), and two sets of resistance circuits (RA1–RAn, RB1–RBn).

The current source (Is) is coupled between a ground terminal (GND) and node N1. The first amplifier circuit (AmpA) includes an inverting input that is coupled to node N1, a non-inverting input that is coupled to node N2, and an output that is coupled to node N4. The second amplifier circuit (AmpB) includes an inverting input that is coupled to node N1, a non-inverting input that is coupled to node N3, and an output that is coupled to node N5. The first reference circuit (VrefA) is coupled between node N2 and a ground terminal (GND). The second reference circuit (VrefB) is coupled between node N3 and the ground terminal (GND).

The first MOS transistor (MA1) of the first set of MOS transistors (MA1–MAn) includes a gate that is coupled to node N4, a source that is coupled to the ground terminal (GND), and a drain that is coupled to node N6. The second MOS transistor (MA2) of the first set of MOS transistors (MA1–MAn) includes a gate that is coupled to node N4, a source that is coupled to the ground terminal (GND), and a drain that is coupled to node N7. The third MOS transistor (MAn) of the first set of MOS transistors (MA1–MAn) includes a gate that is coupled to node N4, a source that is coupled to the ground terminal (GND), and a drain that is coupled to node N8.

The first MOS transistor (MB1) of the second set of MOS transistors (MB1–MBn) includes a gate that is coupled to node N5, a source that is coupled to the ground terminal (GND), and a drain that is coupled to node N6. The second MOS transistor (MB2) of the second set of MOS transistors (MB1–MBn) includes a gate that is coupled to node N5, a source that is coupled to the ground terminal (GND), and a drain that is coupled to node N7. The third MOS transistor (MBn) of the second set of MOS transistors (MB1–MBn) includes a gate that is coupled to node N5, a source that is coupled to the ground terminal (GND), and a drain that is coupled to node N8.

The first MOS transistor (Ms1) of the third set of MOS transistors (Ms1–Msn) includes a gate that is coupled to node N6, a source that is coupled to the power supply node (VDD), and a drain that is coupled to node N1. The second MOS transistor (Ms2) of the third set of MOS transistors (Ms1–Msn) includes a gate that is coupled to node N7, a source that is coupled to the power supply node (VDD), and a drain that is coupled to node N1. The third MOS transistor (Msn) of the third set of MOS transistors (Ms1–Msn) includes a gate that is coupled to node N8, a source that is coupled to the power supply node (VDD), and a drain that is coupled to node N1.

The first resistance circuit (RA1) of the first set of resistance circuits (RA1–RAn) is coupled between node N6 and the power supply node (VDD). The second resistance circuit (RA2) of the first set of resistance circuits (RA1–RAn) is coupled between node N7 and the power supply node (VDD). The third resistance circuit (RAn) of the first set of resistance circuits (RA1–RAn) is coupled between node N8 and the power supply node (VDD).

The first resistance circuit (RB1) of the second set of resistance circuits (RB1–RBn) is coupled between node N6 and the power supply node (VDD). The second resistance circuit (RB2) of the second set of resistance circuits (RB1–RBn) is coupled between node N7 and the power supply node (VDD). The third resistance circuit (RBn) of the second set of resistance circuits (RB1–RBn) is coupled between node N8 and the power supply node (VDD).

The regulator circuit (500) is an alternative embodiment that operates similarly to the regulator circuit (300) shown in FIG. 3. The regulator circuit (500) is configured with the current source (Is) providing a current that draws the potential at node N1 to ground (GND). The regulator circuit (500) is arranged to selectively deactivate PMOS transistors (Ms1–Msn) such that the current source (Is) decreases the potential at node N1.

The MOS transistors within the bias portion of the regulator circuits (100–500) described in FIGS. 1–5 may be replaced by other bypass circuits such as a bias transistor. In addition, the MOS transistors within the shunt portion of the regulator circuits (100–500) described in FIGS. 1–5 may be replaced by other pass circuits such as a pass transistor.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for regulating a source potential that is provided to a source node by a source circuit, the apparatus comprising:
    a first amplifier circuit that includes a first input that is coupled to the source node, a second input that is coupled to a first reference potential, and an output that is arranged to provide a first control signal;
    a second amplifier circuit that includes a first input that is coupled to the source node, a second input that is coupled to a second reference potential, and an output that is arranged to provide a second control signal;
    a first bias stage that is arranged to provide a first bias signal in response to the first control signal;
    a second bias stage that is arranged to provide a second bias signal in response to the second control signal, wherein the first and second bias stages are arranged to cooperate with one another such that one of the first and second bias signals will provide a dominant bias signal; and
    a shunt circuit that is coupled to the source node and arranged to shunt the source potential in response to the dominant bias signal such that closed loop regulation is maintained when one of two regulation loops are defective, wherein the first regulation loop includes the first amplifier circuit, the first bias stage, and the shunt circuit, and the second regulation loop includes the second amplifier circuit, the second bias stage, and the shunt circuit.

2. An apparatus as in claim 1, wherein the first bias stage further comprises an array of bypass circuits that are arranged to provide a first array of bias signals in response to the first control signal, and wherein the shunt circuit further comprises an array of pass circuits that are coupled to the source node such that each of the array of pass circuits is responsive to a corresponding one of the first array of bias signals, and regulation is maintained when at least one regulation loop that includes on of the array of pass circuits is operable.

3. An apparatus as in claim 2, wherein the bypass circuits include PMOS transistors and the pass circuits include NMOS transistors.

4. An apparatus as in claim 2, wherein the bypass circuits include NMOS transistors and the pass circuits include PMOS transistors.

5. An apparatus as in claim 2, wherein the bypass circuits are isolated from one another such that each of the bypass circuits is unaffected by a failure in another one of the bypass circuits.

6. An apparatus as in claim 2, wherein the pass circuits are isolated from one another such that each pass circuits is unaffected by a failure in another one of the pass circuits.

7. An apparatus as in claim 2, further comprising an array of capacitance circuits, wherein each capacitance circuit of the array of capacitance circuits is coupled to a corresponding one of the array of bypass circuits and a compensation node within the first amplifier circuit such that the first amplifier remain stable when one of the bypass circuits in the array of bypass circuits fails.

8. An apparatus as in claim 1, wherein each pass circuit is activated in response to a higher potential, wherein the higher potential corresponds to one of the bias signals that has a higher corresponding potential.

9. An apparatus as in claim 1, wherein each pass circuit is activated in response to a lower potential, wherein the lower potential corresponds to one of the bias signals that has a lower corresponding potential.

10. An apparatus as in claim 1, wherein the first bias stage includes a first transistor that is coupled to a first passive load, and second bias stage includes a second transistor that is coupled to a second passive load, wherein the first and second transistors are arranged to cooperate with one another such that closed loop regulation is maintained when one of the two transistors are inoperable.

11. A method for regulating a source potential that is provided to a source node by a source circuit, the method comprising:
    comparing the source potential to a first reference potential to provide a first control signal in a first control loop;
    comparing the source potential to a second reference potential to provide a second control signal in a second control loop;
    activating a first MOS transistor in response to the first control signal when the source potential is out of regulation with respect to the first reference potential, wherein the first MOS transistor is arranged to provide a first bias signal in the first control loop;
    activating a second MOS transistor in response to the second control signal when the source potential is out of regulation with respect to the second reference potential, wherein the second MOS transistor is arranged to provide a second bias signal in the second control loop;
    selecting a dominant one of the first and second bias signals to provide a dominant bias signal; and
    activating a shunt circuit in response to the dominant bias signal such that the source potential is regulated when at least one of the first and second control loops are operable.

12. A method as in claim 11, further comprising:
    activating at least a third MOS transistor in response to the first control signal when the source potential is out of regulation with respect to the first reference potential, wherein the third MOS transistor is arranged to provide a third bias signal in a third control loop;
    activating at least a fourth MOS transistor in response to the second control signal when the source potential is out of regulation with respect to the second reference potential, wherein the fourth MOS transistor is arranged to provide a fourth bias signal in a fourth control loop;
    selecting a dominant one of the first and second bias signals to provide a first dominant bias signal;
    selecting a dominant one of the second and third bias signals to provide a second dominant bias signal;
    activating a first pass circuit in the shunt circuit in response to the first dominant bias signal; and
    activating a second pass circuit in the shunt circuit in response to the second dominant bias signal such that the source potential is regulated by one of the first and second pass circuits when at least one of the first, second, third, and fourth control loops are operable.

13. A method as in claim 12, wherein activating the first and second pass circuits further comprises regulating the source potential with the first pass circuit when the first pass circuit is activated by the dominant bias signal, and regulating the source potential with the second pass circuit when the second pass circuit is activated by the dominant bias signal.

14. A method as in claim 12, further comprising isolating the first, second, third, and fourth control loops from one another such that at least one of the first, second, third, and fourth control loops are operable when a defect occurs within another one of the first, second, third, and fourth control loops.

15. A method as in claim 11, further comprising reducing gain to the first MOS transistor with a first capacitance circuit and reducing gain to the second MOS transistor with a second capacitance circuit such that stable closed loop regulation is maintained when one of two MOS transistors is inoperable.

16. A method as in claim 11, wherein activating the first MOS transistor further comprises drawing a the first bias signal towards a predetermined potential with a passive resistance circuit when the first MOS transistor is deactivated.

17. A method as in claim 11, wherein activating the second MOS transistor further comprises drawing a the second bias signal towards a predetermined potential with a passive resistance circuit when the second MOS transistor is deactivated.

18. A method as in claim 11, wherein selecting a dominant one of the first and second bias signals further comprises selecting the bias signal that regulates the source potential to the lowest potential.

19. An apparatus for regulating a source potential that is provided to a source node by a source circuit, the apparatus comprising:

a first means for comparing that is arranged to compare the source potential to a first reference potential to provide a first control signal in a first control loop;

a second means for comparing that is arranged to compare the source potential to a second reference potential to provide a second control signal in a second control loop;

a first means for biasing that is arranged to provide a first bias signal in response to the first control signal when the source potential is out of regulation with respect to the first reference potential;

a second means for biasing that is arranged to provide a second bias signal in response to the second control signal when the source potential is out of regulation with respect to the second reference potential;

a means for selecting that is arranged to select a dominant one of the first and second bias signals to provide a dominant bias signal; and a means for regulating that is arranged to regulate the source potential in response to the dominant bias signal when at least one of the first and second control loops are operable.

* * * * *

UNITED STATES PATENT AND TRADEMARK OFFICE
CERTIFICATE OF CORRECTION

PATENT NO.   : 6,541,945 B1
DATED        : April 1, 2003
INVENTOR(S)  : Gregory J. Smith It is certified that error appears in the above-identified patent and that said Letters Patent is hereby corrected as shown below:

Column 2,
Line 12, replace "or" with -- for --.

Column 4,
Line 53, after "single-transistor" add -- inverting --.

Column 11,
Lines 24 and 29, after "drawing" remove "a".

Signed and Sealed this

Eighth Day of July, 2003

JAMES E. ROGAN
*Director of the United States Patent and Trademark Office*